United States Patent
Avalos Garcia et al.

(10) Patent No.: US 10,939,592 B2
(45) Date of Patent: Mar. 2, 2021

(54) LIQUID COOLING SYSTEM WITH SUB ATMOSPHERIC PRESSURE COOLANT

(71) Applicant: Intel Corporation, Santa Clara, CA (US)

(72) Inventors: Javier Avalos Garcia, Zapopan (MX); Michael Berktold, Phoenix, AZ (US); Luz Karine Sandoval Granados, Zapopan (MX); Adriana Lopez Iniguez, Zapopan (MX)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/442,207

(22) Filed: Jun. 14, 2019

(65) Prior Publication Data
US 2019/0297754 A1    Sep. 26, 2019

(51) Int. Cl.
H05K 7/20    (2006.01)

(52) U.S. Cl.
CPC ..... H05K 7/20927 (2013.01); H05K 7/20272 (2013.01); H05K 7/20281 (2013.01)

(58) Field of Classification Search
CPC ..... H01L 23/473; H01L 23/427; H01L 23/34; H01L 23/345; H01L 23/367; H05K 7/20272; H05K 7/20772; H05K 7/20236; H05K 7/20263; H05K 7/20281; H05K 7/20327; H05K 7/20763; H05K 7/20836; H05K 7/20781; H05K 7/2079; H05K 7/20927; H05K 7/20336; H05K 7/2039; H05K 7/20436; H05K 7/20509; H05K 7/20818; H05K 7/20872; H05K 7/20909; G06F 1/20; G06F 2200/201; G06F 1/206
See application file for complete search history.

(56) References Cited

U.S. PATENT DOCUMENTS

| | | | | |
|---|---|---|---|---|
| 5,703,536 A | * | 12/1997 | Davis | H04B 1/036 330/289 |
| 6,948,556 B1 | * | 9/2005 | Anderson | F28D 15/0266 165/104.26 |
| 7,334,630 B2 | * | 2/2008 | Goodson | F04B 19/006 165/104.33 |
| 7,336,487 B1 | * | 2/2008 | Chrysler | H01L 23/473 165/104.33 |
| 2004/0104012 A1 | * | 6/2004 | Zhou | H01L 23/427 165/104.26 |
| 2005/0224212 A1 | * | 10/2005 | East | B23K 20/02 165/80.4 |
| 2005/0284604 A1 | * | 12/2005 | Mongia | H01L 23/473 165/46 |
| 2006/0126293 A1 | * | 6/2006 | Campbell | H05K 7/2079 361/699 |

(Continued)

Primary Examiner — Binh B Tran
Assistant Examiner — Michael A Matey
(74) Attorney, Agent, or Firm — Compass IP Law PC

(57) ABSTRACT

A liquid cooling system is described. The liquid cooling system includes a heat sink to provide a warmed liquid. The heat sink is to receive heat generated by at least one semiconductor chip of an electronic system. The liquid cooling system includes a heat exchanger to receive the warmed liquid and to provide a cooled liquid. The liquid cooling system includes a pump. The pump is to draw the cooled liquid at the pump's input so that respective pressures of the warmed and cooled liquids' are less than atmospheric pressure.

17 Claims, 9 Drawing Sheets

(56) References Cited

U.S. PATENT DOCUMENTS

| | | | |
|---|---|---|---|
| 2006/0131737 A1* | 6/2006 | Im | H01L 23/3128 257/717 |
| 2007/0029069 A1* | 2/2007 | Duan | G06F 1/20 165/80.4 |
| 2007/0215316 A1* | 9/2007 | Saito | H02M 7/003 165/41 |
| 2007/0227708 A1* | 10/2007 | Hom | G06F 1/20 165/121 |
| 2009/0052136 A1* | 2/2009 | Chung | H01L 23/473 361/702 |
| 2010/0128436 A1* | 5/2010 | Edmunds | H01L 23/427 361/700 |
| 2012/0125029 A1* | 5/2012 | Moreau | F24D 3/18 62/235.1 |
| 2012/0180979 A1* | 7/2012 | Harrington | F28D 1/0246 165/11.1 |
| 2013/0319635 A1* | 12/2013 | Kobayashi | B61C 17/00 165/104.11 |
| 2014/0202678 A1* | 7/2014 | Goth | F28F 27/02 165/287 |
| 2015/0351290 A1* | 12/2015 | Shedd | F25B 23/006 361/679.47 |
| 2016/0066472 A1* | 3/2016 | Cader | G06F 1/20 361/699 |
| 2016/0128238 A1* | 5/2016 | Shedd | F28D 15/00 361/679.47 |
| 2017/0127563 A1* | 5/2017 | Chainer | H05K 7/20818 |
| 2018/0088607 A1* | 3/2018 | Chainer | G06F 1/20 |
| 2018/0098464 A1* | 4/2018 | Ishinabe | H05K 7/20781 |
| 2018/0155048 A1* | 6/2018 | Surawski | F02M 21/06 |
| 2019/0069450 A1* | 2/2019 | Suzuki | H05K 7/20909 |
| 2019/0128271 A1* | 5/2019 | Campbell | F04D 29/20 |

* cited by examiner

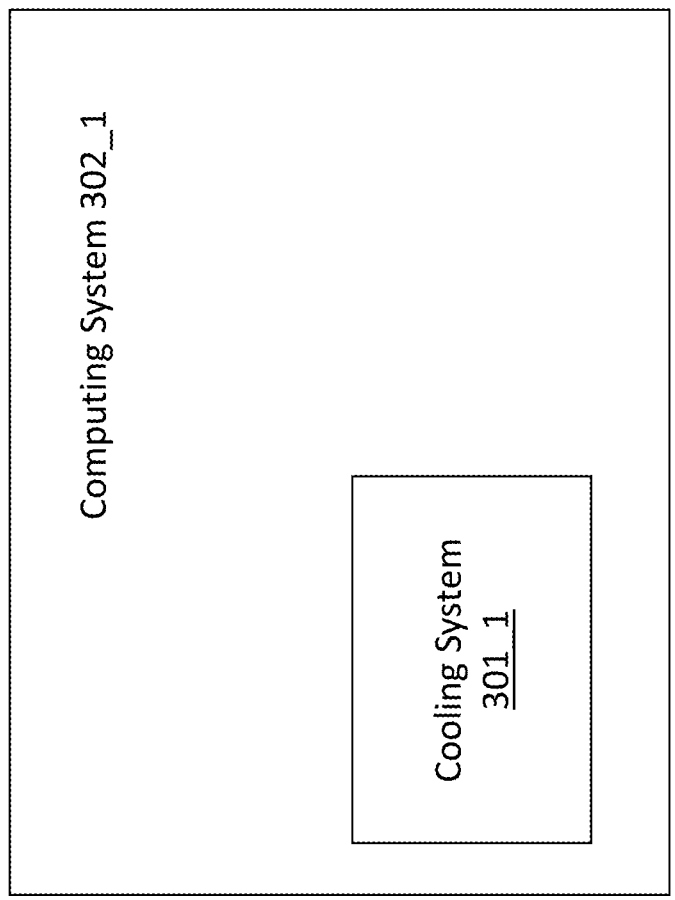

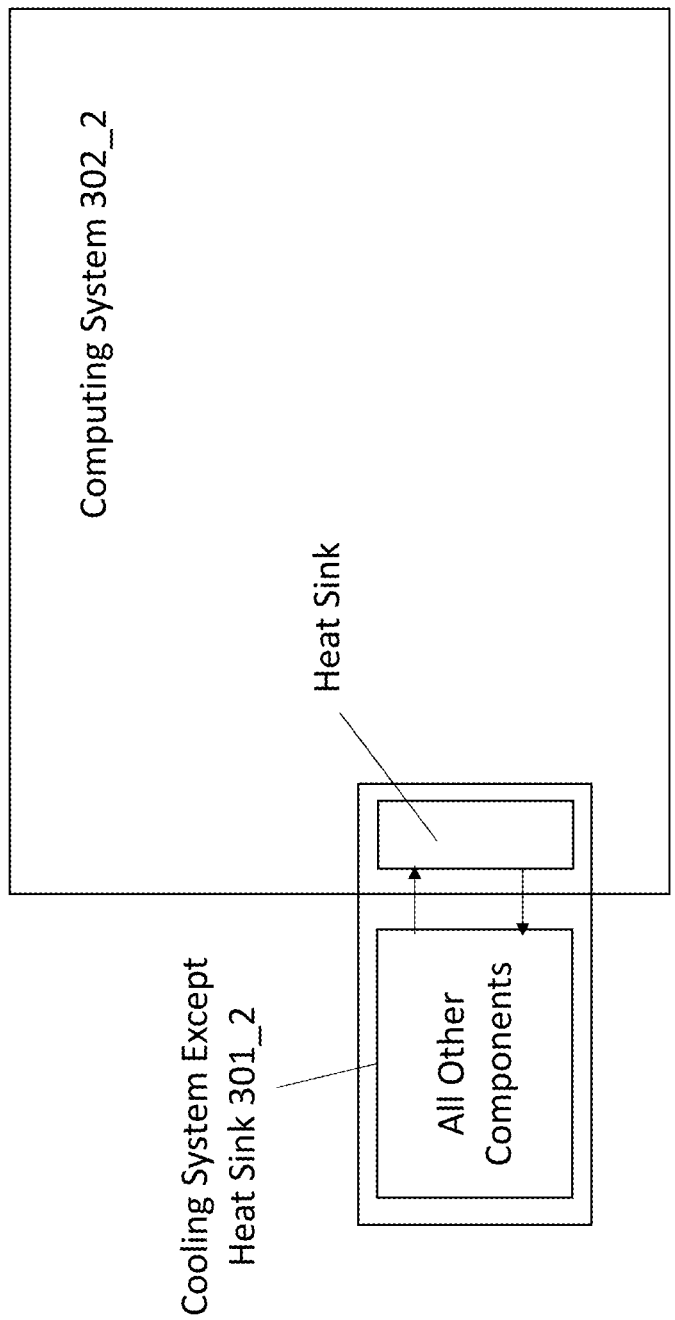

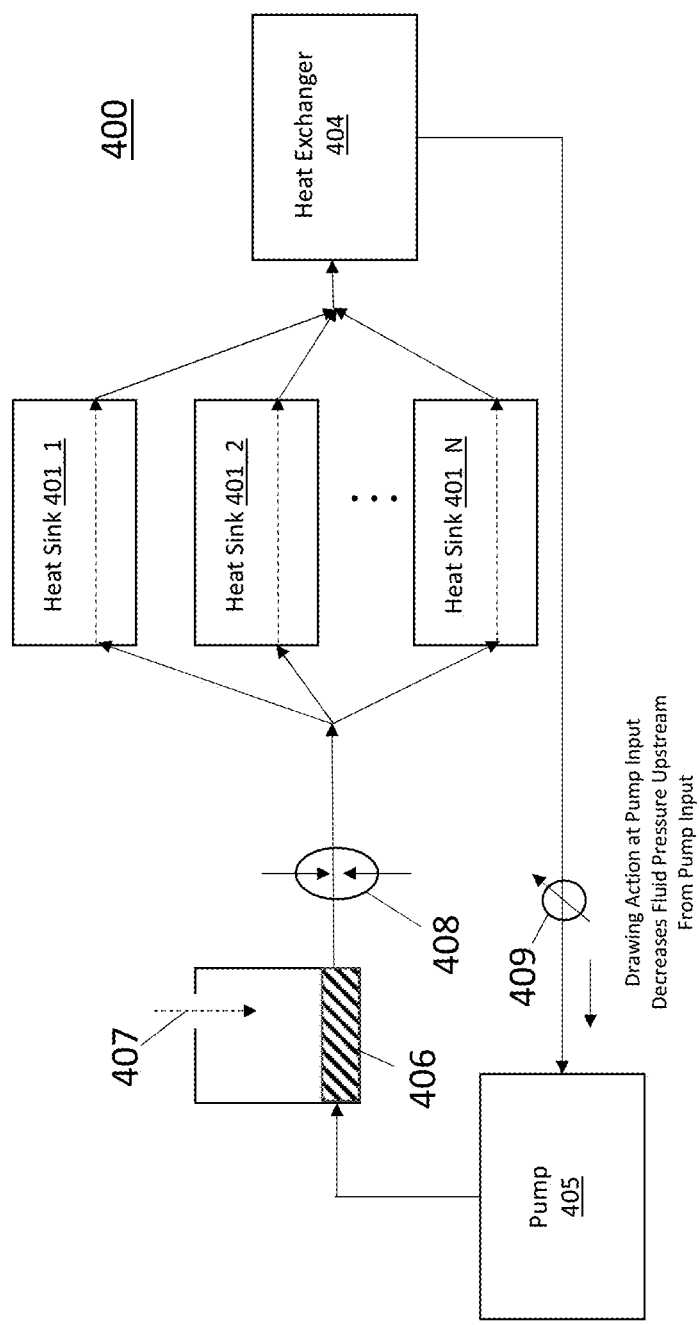

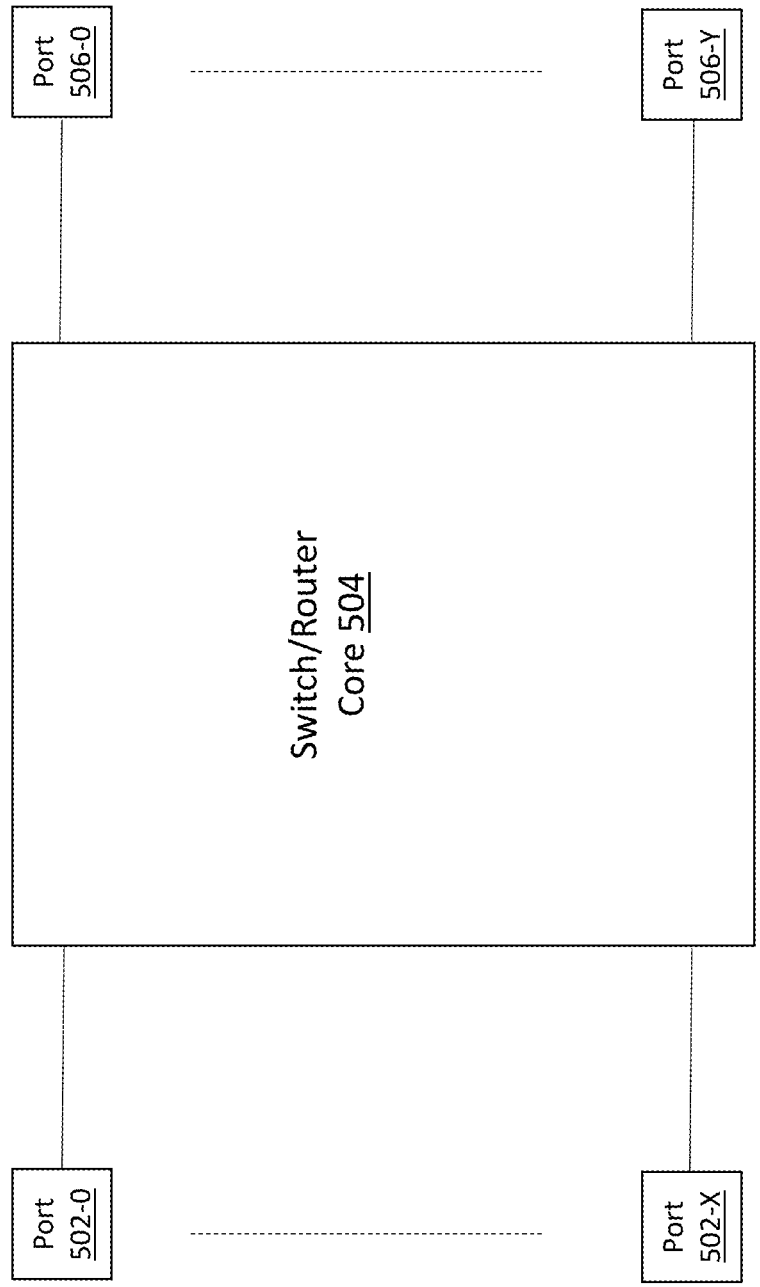

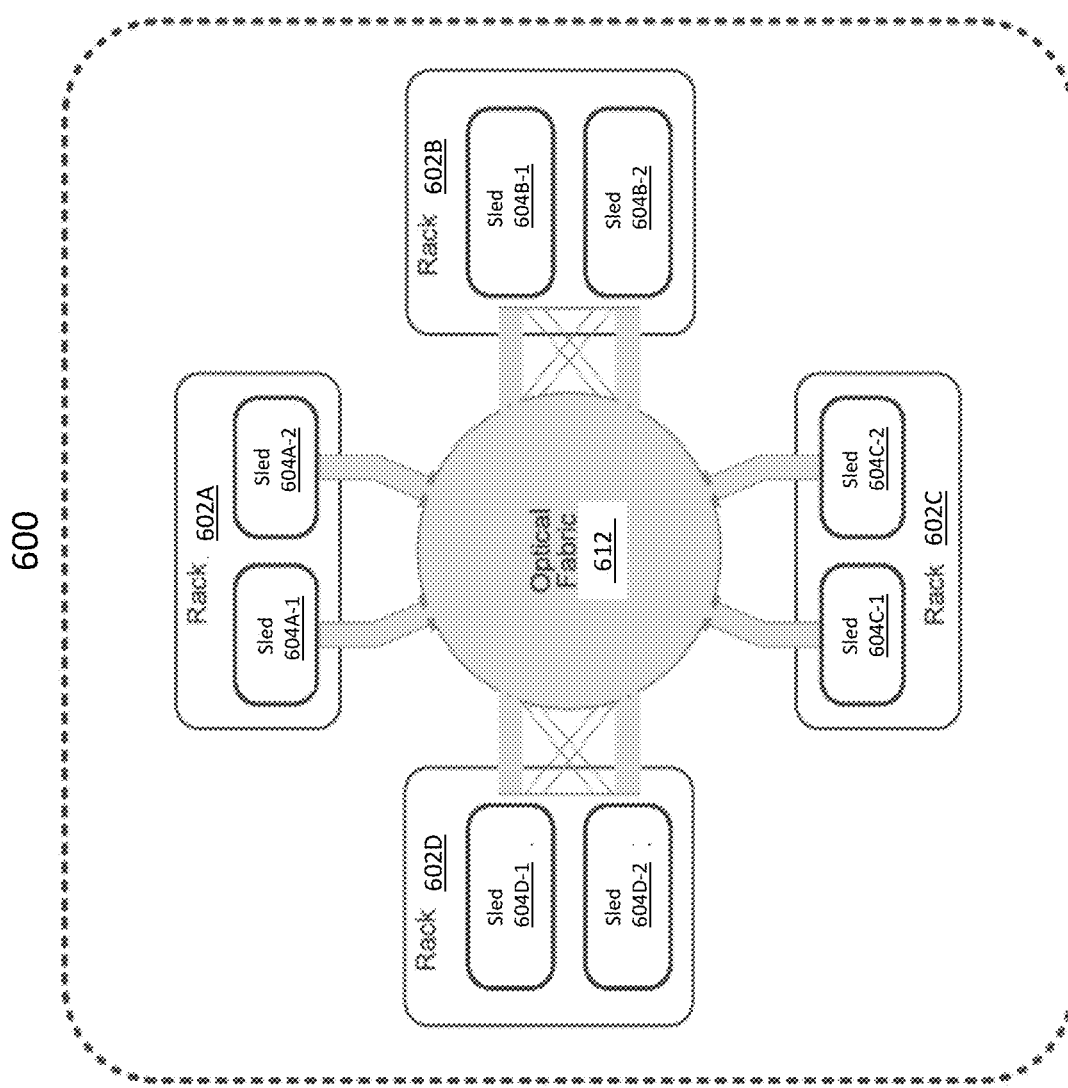

LIQUID COOLING SYSTEM WITH SUB ATMOSPHERIC PRESSURE COOLANT

FIELD OF INVENTION

The field of invention pertains generally to the electronic and mechanical arts, and, more specifically, to a liquid cooling system with sub atmospheric pressure coolant.

BACKGROUND

As computing systems (and the semiconductor chips they are composed of) continue to pack higher performance into smaller form factors, the power consumption per unit area of such systems/chips continues to increase. With the increase in power consumption per unit area, the thermal radiation of the systems/chips is also steadily rising. At least for certain environments, such as a data center where large numbers of high performance computing systems are packed into a small area of space (e.g., racks of blade servers), keeping these systems sufficiently cool with airflow is becoming less and less feasible. As such, many system designers are looking into liquid cooling as an alternative to air cooling. Liquid cooling is essentially a more efficient cooling technique than air cooling (the heat removal mechanism captures and removes more heat than air flow).

FIGURES

A better understanding of the present invention can be obtained from the following detailed description in conjunction with the following drawings, in which:

FIGS. 3a, 3b and 3c show different possible implementations of the improved liquid cooling system of FIG. 2;

FIG. 4 shows an alternative embodiment of the improved liquid cooling system of claim 2;

FIGS. 5a and 5b show computing and networking systems, respectively;

FIG. 6 shows a depiction of a data center.

DETAILED DESCRIPTION

Figure 1:
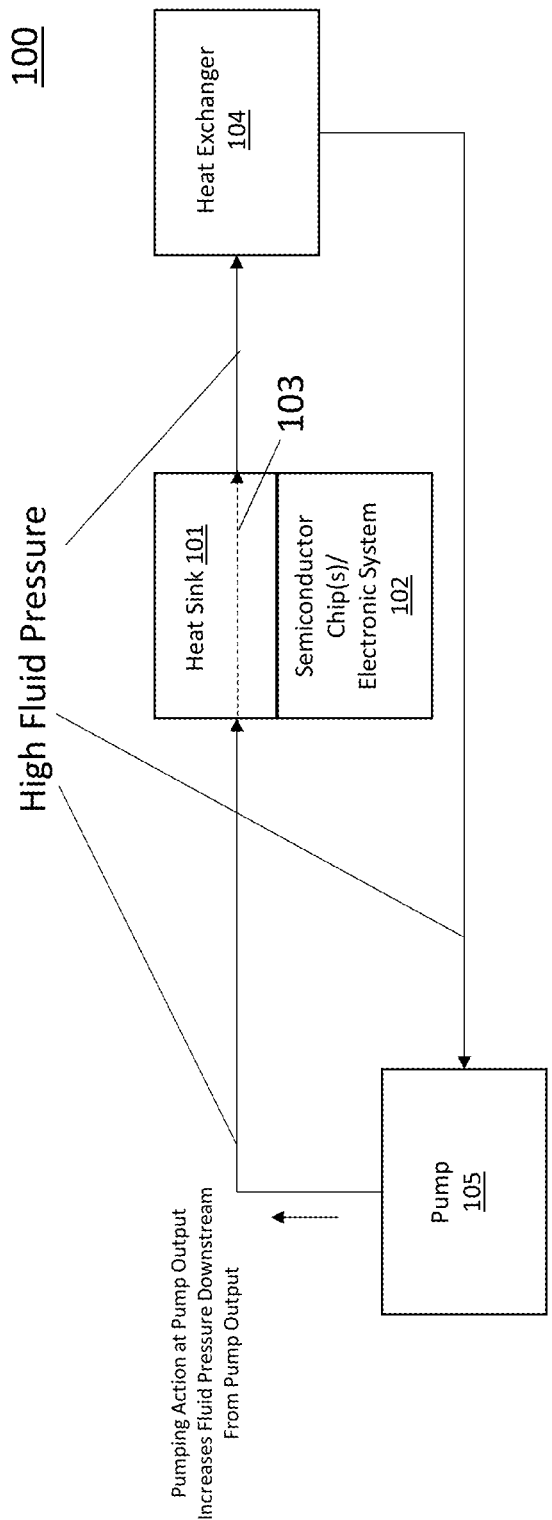
FIG. 1 shows a prior art liquid cooling system.

As observed in FIG. 1, in the case of a standard liquid cooling system 100, generally, a heat sink structure 101 that is thermally coupled to one or more semiconductor chips or larger electronic systems 102 (e.g., by being placed in contact with the chip(s)/system(s) or their packaging) removes heat from the chip(s)/system(s) 102. The heat sink 101 also includes an internal fluidic channel 103.

When cooled liquid flows through the heat sink's fluidic channel 103, the heat that was received by the heat sink 101 from the chip(s)/system(s) is removed from the heat sink 101. The warmed fluid flowing out of the heat sink 101 is then directed through a heat exchanger 104 which removes the heat from the fluid. The cooled fluid is then re-driven by a pump 105 through the heat sink's fluidic channel 103 and the process repeats. With a steady volume of cooled fluid continuously flowing through the heat sink 101, the heat generated by the chip(s)/system(s) 102 is continually removed from their packaging structure thereby keeping the temperature(s) of the chip(s)/system(s) 102 within acceptable operating limits.

A problem, however, is the reliability of the hoses, assorted fixtures (e.g., valves, nozzles, fittings, etc.) and components (e.g., heat sink, heat exchanger) needed to physically construct the liquid cooled system 100. Here, for instance, flexible hoses with associated hardware are physically connected, e.g., between the heat sink 101 and heat exchanger 104, between the heat exchanger 104 and a pump 105 that pumps fluid through the liquid cooling system 100 and between the pump 105 and heat sink 101.

Should there be a failure of any of the tubes and/or system components in the standard liquid cooling system 100, liquid will leak out of the system. For example, if a tube develops a splice opening, liquid will leak out of the tube and disperse over the larger system's electronic components (e.g., over a PC board having many semiconductor chips disposed on it) resulting in damage to the components and/or larger electronic system.

Moreover, the leaking of the fluid may be particularly forceful because of the internal pressure of the liquid within the liquid cooling system 100. That is, in the case of the traditional liquid cooling system 100 of FIG. 1, the mechanical action of the pump 105 is to forcefully pump liquid from the pump output which has the effect of increasing the pressure of the liquid downstream from the pump output.

The increased pressure of the liquid downstream from the output of the pump 105 physically drives the fluid through the liquid cooling system's fluidic channels (i.e., causes the fluid to flow through the liquid cooling system). Thus, the fluid is maintained in the liquid cooling system at high pressure. More specifically, the fluid is maintained at pressures that exceed atmospheric pressure. With the fluid maintained at pressures that exceed atmospheric pressure, if a splice or other opening appears in the fluidic channel, the liquid will "squirt" out of the opening or otherwise be forcefully driven from the opening because of the lower, atmospheric pressure that exists outside the fluidic channel. The squirting of the fluid essentially sprays the electronic system in the vicinity of the opening with the liquid which potentially damages the electronic system.

Figure 2:
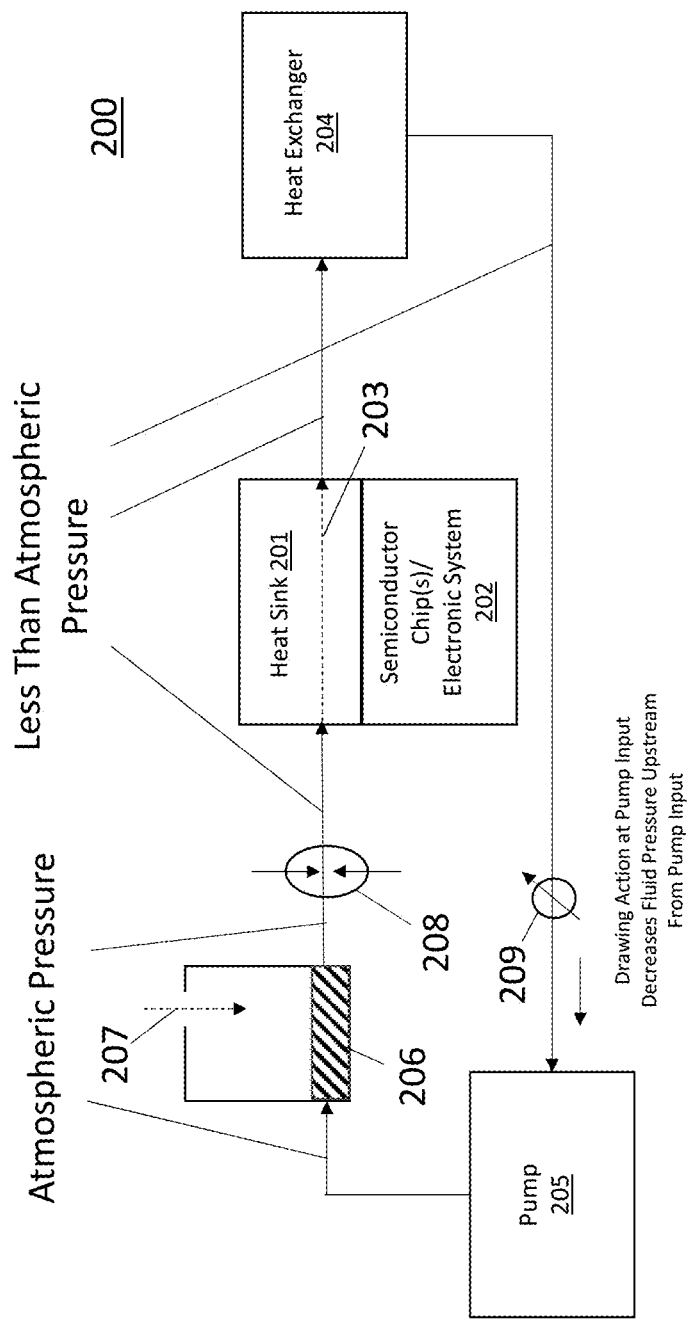
FIG. 2 shows an improved liquid cooling system.

FIG. 2 shows an improved liquid cooling system 200 in which the fluid is purposely maintained at pressures that are less than atmospheric pressure. With the liquid being maintained at pressures that are less than atmospheric pressure, if an opening appears in the fluidic channel, air bubbles will "bubble into" the fluidic channel from the surrounding ambient. That is, rather than have liquid squirt out of the fluidic channel in response to an opening as with a traditional liquid cooling system 100 of FIG. 1, instead, in the case of the improved liquid cooling system 200 of FIG. 2, air from the surrounding ambient will be injected into the fluidic channel at the opening. As such, the larger electronic system and/or its internal components will not be damaged from fluid that is sprayed from the opening.

According to the design of the improved liquid cooling system 200 of FIG. 2, rather than forcefully pump fluid at its output, the pump 205, instead, sucks or "draws" fluid from the fluidic channel at its input. The drawing action at the input of the pump 205 causes a reduction in fluidic pressure within the fluidic channel upstream from the pump input. Here, with a steady fluidic draw at the input of the pump 205, the internal pressure of the liquid can be driven to pressures that are well below atmospheric pressure upstream from the pump input as described in detail immediately below.

As depicted in the embodiment of FIG. 2, the output of the pump 205 is connected to a reservoir 206 having an opening 207 for ambient air that is at atmospheric pressure. The opening 207 and subsequent entry of ambient air into the reservoir 206 effectively sets a "reference" pressure for the system at atmospheric pressure. That is, because of the opening 207 in the reservoir 206, the liquid is maintained at atmospheric pressure from the output of the pump through the reservoir and up to constriction point 208. The constriction point 208 is a region where the cross sectional area of the fluidic flow is narrowed.

According to standard fluid dynamics, a fluid that flows through a constriction point 208 is characterized by higher pressure upstream from the constriction point 208 and lower pressure downstream from the constriction point 208. Thus, the constriction point 208 is the physical location in the system where the fluid transitions from the higher reference atmospheric pressure (upstream from the constriction point 208) to a lower pressure (downstream from the constriction point 208) resulting from the fluidic draw at the pump input. That is, the fluidic draw at the pump input maintains a fluid pressure that is less than atmospheric pressure from the output of the constriction point 208 all the way to the input of the pump 205.

Thus, to use a particular electronic circuit as an analogy for the design and operation of the improved liquid cooling system 200 of FIG. 2, the reservoir 206 corresponds to a ground reference potential that sets the highest potential of the circuit, the pump input corresponds to a negative supply potential that sets the lowest potential of the circuit, the constriction point 208 corresponds to a resistance having a ground-to-negative supply drop in potential across it, and, current flows from the ground reference through the resistance to the negative supply (resistances of the other components and channel segments are ignored for simplicity). The pump 205 corresponds to a source of negative potential whose reference terminal is coupled to ground (the reservoir) and whose output terminal coupled to the pump input.

Thus, should there be an opening anywhere in the fluidic channel between the output of the constriction point 208 and the input to the pump 205, air bubbles will bubble into the fluidic channel rather than liquid spraying or leaking from the fluidic channel. As can be seen in FIG. 2, the less than atmospheric pressure region of the liquid extends over most of the system. That is, it includes the fluidic channel from the output of the constriction point 208 to the heat sink 201, the internal fluidic channel 203 of the heat sink 201, the fluidic channel from the heat sink to the heat exchanger 204, the fluidic channel from the heat exchanger 204 to the input of the pump 205. Thus, should there be an opening in any of these fluidic channels or components of the fluidic channel, again, air will bubble into the fluidic channel rather than liquid squirting/leaking from the fluidic channel.

Besides preventing the leaking of liquid from an opening in any of these components, the existence of any such opening in these components is additionally readily detected with a turbidity meter or other meter 209 that can detect the presence of air bubbles in the liquid. Here, turbidity is a measure of how murky the liquid is. In various embodiments the liquid includes substances to keep the boiling point of the liquid high and/or prevent corrosion of metal surfaces within the fluidic system. The presence of such substances, and/or outright dyes, give the fluid a murky appearance (e.g., a murky green).

If air bubbles are present in the liquid as a consequence of an opening in the low pressure region of the system, the liquid will become less murky (e.g., a lighter green) which a turbidity meter will detect. Any such detection can raise an alarm that indicates a leak has been detected in the system. As such, corrective action can be taken without any damage being done to any electrical or other components.

Here, various types of liquids can be used in the system. Glycol-based "green" liquids (or "coolants") often have silicate and/or phosphate corrosion inhibitors to inhibit corrosion on both iron and aluminum surfaces. Coolants based on the organic acid technology (OAT) contain 2-ethylhexanoic-acid or 2-EHA and other organic adds to give longer coolant life. OAT coolants can have various colors such as orange, pink or dark green. Again, any such coloring causes the liquid to have a murky appearance, and, any addition of injected air bubbles will cause the coolant to become less murky.

In other embodiments other types of meters may be used such as a meter that detects the liquid's density or specific gravity (the density or specific gravity of the liquid will decrease as a consequence of injected air bubbles) or a meter that detects the liquid's viscosity (the viscosity of the liquid will decrease as a consequence of injected air bubbles) or a meter that detects the amount of oxygen and/or nitrogen in the liquid or other gas associated with the ambient surrounding the system (the amount of oxygen, nitrogen, etc. in the liquid will increase as a consequence of injected air bubbles).

Also, various types of pumps that draw an input fluid rather than pump an output fluid can be used including kinetic pumps (e.g., centrifugal pumps) and displacement pumps (e.g., reciprocating pumps, rotary pumps, etc.).

Although FIG. 2 shows an opening in the reservoir to expose the reservoir's liquid to the surrounding ambient at atmospheric pressure, in alternate embodiments gases or liquids of other pressures (e.g., higher than atmospheric pressure) can be injected into the opening (e.g., with another pump) to set the pressure between the pump output and constriction input to any such other pressure.

Figure 3C:
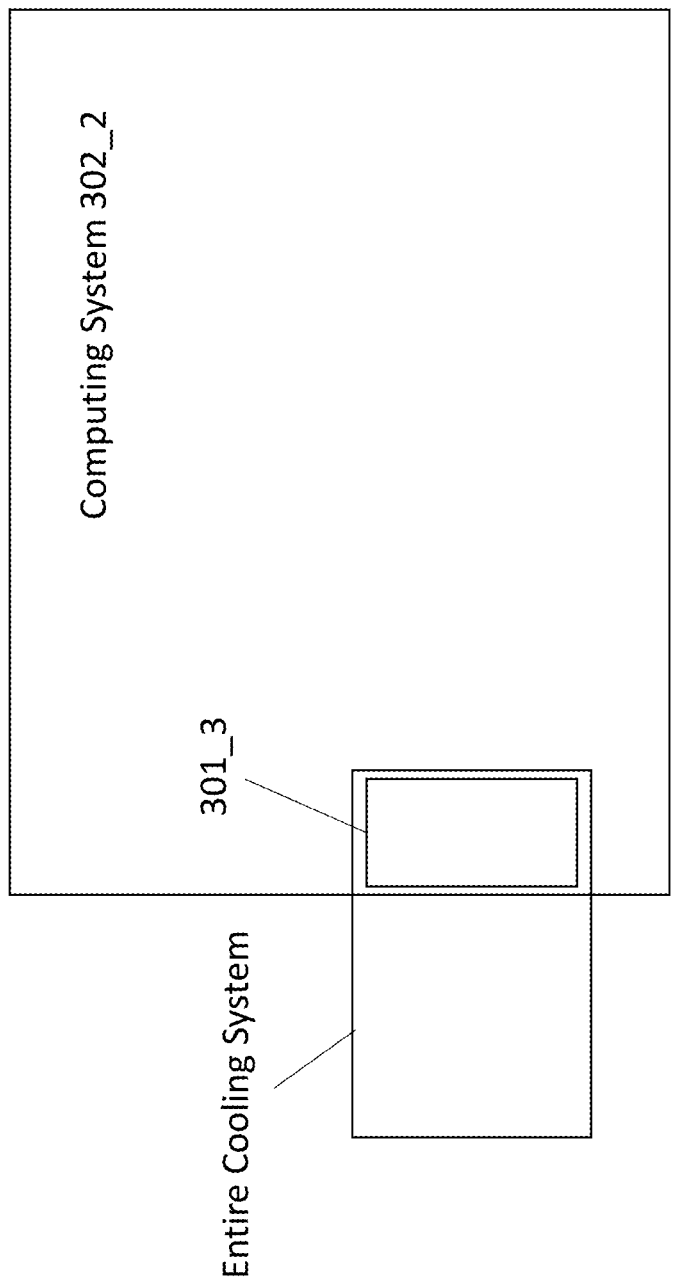

FIGS. 3a through 3c show various manners in which the improved liquid cooling system 200 of FIG. 2 can be implemented. According to the first approach of FIG. 3a, the entire liquid cooling system 301 is integrated into the computing system hardware 302_1. For example, in the case of a high performance computer such as a mainframe or high performance server, the liquid cooling system 301 is entirely integrated within the chassis 302 of the computer.

According to the second approach of FIG. 3b, the entire cooling system except for the heat sink (and possibly the hoses that flow to and from the heat sink) 301_2 reside externally from the computing system hardware 302_2. For example, in the case of blade server where each card or board corresponds to a server computer, the heat sink for a semiconductor chip or multi-chip module on the card/board can couple to the remainder of the cooling system which is mechanically coupled to the rack or backplane that the card/board is coupled to, or, can even be coupled to a more distant location (e.g., outside of the building where the blade server resides).

The approach of FIG. 3c is a hybrid between the respective approaches of FIGS. 3a and 3b. Here, the heat sink and at least one other component 301_3 (e.g., the heat exchanger 204, the pump 205, the reservoir 206) are integrated within the computing system hardware 302_3 while the remainder of the liquid cooling system remains outside the computing system hardware.

FIG. 4 shows a liquid cooling system 400 that is designed according to the principles of the improved system of FIG. 2 but is further designed to remove heat from multiple heat sinks 401_1 through 401_N in parallel. Here, the heat exchanger 404, pump 405 and reservoir 406 are all designed to handle a fluidic volume that equals the combined fluidic volume through all the heat sinks 401.

The heat exchanger 404 is likewise designed to remove the combined heat from all the heat sinks 401 in the system. The system 400 of FIG. 4 can be used, for example, as part of a single computing system and cools, e.g., the most power hungry chips or multi-chip modules in the system (where each such chip or module has its own heat sink). Alternatively, the system 400 of FIG. 4 can be used to cool multiple computing systems (and/or specific chip(s)/module(s) of such computing systems). For example, heat sink 401_1 is associated with a first computing system and heat sink 401_N is associated with another, different computing system.

Note that although each of the heat sinks can be identical and/or otherwise have identical fluid flow and/or identical/comparable heat removal, the same is not a requirement. That is, the heat sinks can have different fluid flows and/or different heat removal properties. So long as the heat exchanger 404 can remove the combined heat from all the heat sinks 401_1 through 401_N and the heat exchanger 404, pump 405 and reservoir 406 can handle the combined fluid flow through all of the heat sinks 401 the system 400 will properly operate.

Although FIG. 4 shows a single constriction point 408 for the entire system 400, in an alternate embodiment or combined embodiment, each sub-channel whose fluid flows through only a particular one of the heat sinks can have its own dedicated constriction point.

Figure 5A:
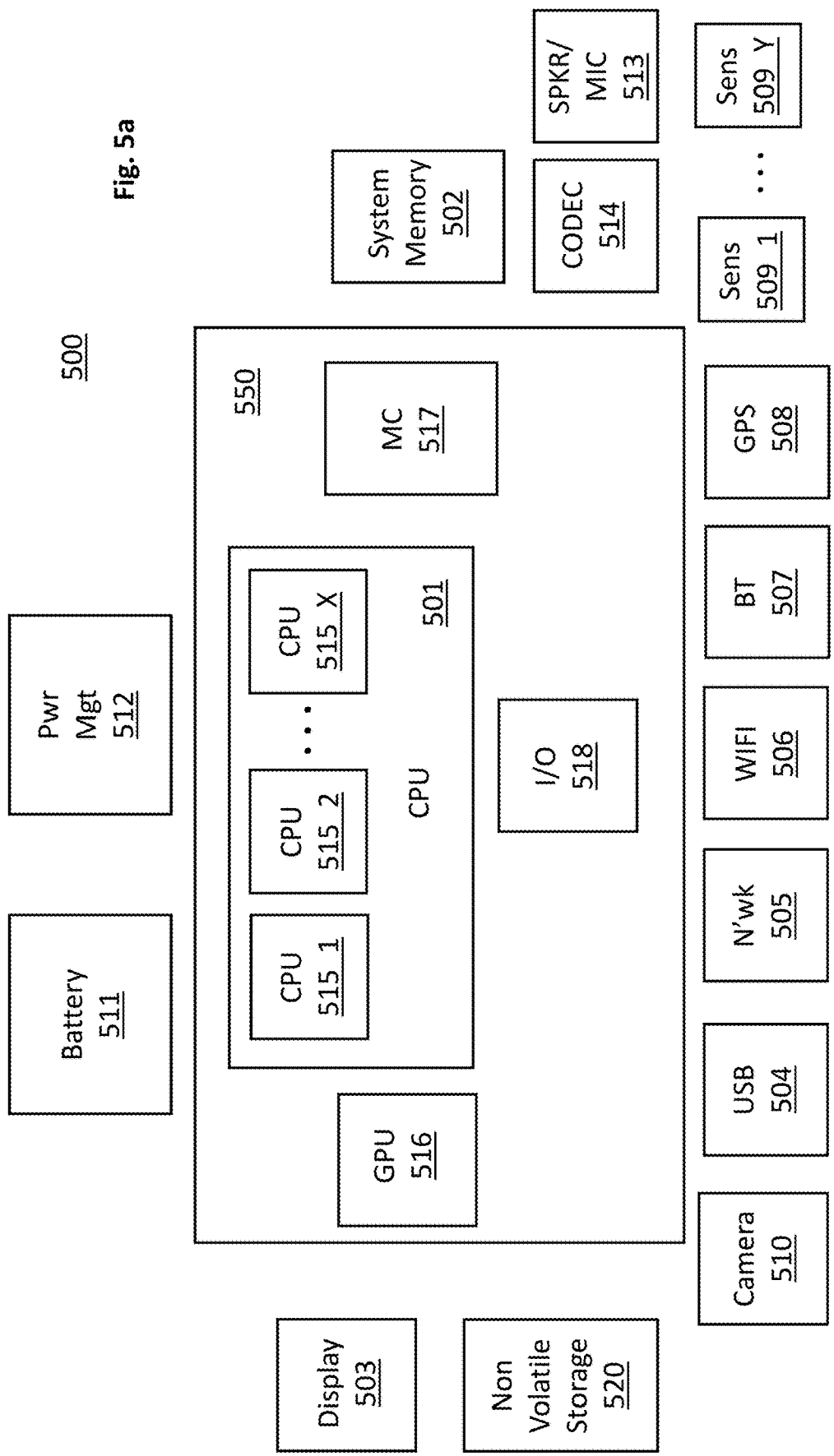

FIG. 5a provides an exemplary depiction of a computing system 500 (e.g., a smartphone, a tablet computer, a laptop computer, a desktop computer, a server computer, etc.). As observed in FIG. 5a, the basic computing system 500 may include a central processing unit 501 (which may include, e.g., a plurality of general purpose processing cores 515_1 through 515_X) and a main memory controller 517 disposed on a multi-core processor or applications processor, system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_Y, one or more cameras 510, a battery 511, a power management control unit 512, a speaker and microphone 513 and an audio coder/decoder 514.

An applications processor or multi-core processor 550 can be an SOC that includes one or more general purpose processing cores 515 within its CPU 501, one or more graphical processing units 516, a memory management function 517 (e.g., a memory controller) and an I/O control function or peripheral controller 518. The general-purpose processing cores 515 typically execute the operating system and application software of the computing system. The graphics processing unit 516 typically executes graphics intensive functions to, e.g., generate graphics information that is presented on the display 503. The memory control function 517 interfaces with the system memory 502 to write/read data to/from system memory 502.

Each of the touchscreen display 503, the communication interfaces 504-507, the GPS interface 508, the sensors 509, the camera(s) 510, and the speaker/microphone codec 513, 514 all can be viewed as various forms of I/O (input and/or output) relative to the overall computing system including, where appropriate, an integrated peripheral device as well (e.g., the one or more cameras 510). Depending on implementation, various ones of these I/O components may be integrated on the applications processor/multi-core processor 550 or may be located off the die or outside the package of the applications processor/multi-core processor 550. The computing system also includes non-volatile storage 520 which may be the mass storage component of the system.

The computing system of FIG. 5a, and/or one or more of its semiconductor chips, can be cooled with a liquid cooling system having liquid pressure that is below atmospheric pressure as described at length above. Although embodiments above have stressed cooling a computer, other kinds of electronic equipment, such as a networking switch or router, can be cooled (and/or have one or more of its semiconductor chips cooled) with a liquid cooling system having liquid pressure that is below atmospheric pressure as described at length above.

FIG. 5b depicts a networking switch or router. Switch/router core 504 can switch/route packets or frames of any format or in accordance with any specification from any port 502-0 to 502-X to any of ports 506-0 to 506-Y (or vice versa). Any of ports 502-0 to 502-X can be connected to a network of one or more interconnected devices. Similarly, any of ports 506-0 to 506-X can be connected to a network of one or more interconnected devices. Switch/router core 504 can decide which port to transfer packets or frames to using a table that maps packet characteristics with an associated output port. In addition, switch/router core 504 can perform packet replication for forwarding of a packet or frame to multiple ports and queuing of packets or frames prior to transfer to an output port.

Here, various components of the computing system of FIG. 5a may be implemented on multiple cards and two or more of such cards may be connected together by a card to card connector having a connection mechanism that incorporates any/all of the teachings provided above. Likewise, various components of the networking switch of FIG. 5b may be implemented on multiple cards (e.g., a switch core card, a network interface card, etc.) and two or more of such cards may be connected together by a card to card connector having a connection mechanism that incorporates any/all of the teachings provided above.

FIG. 6 depicts an example of a data center. Various embodiments can be used in or with the data center of FIG. 6. As shown in FIG. 6, data center 600 may include an optical fabric 612. Optical fabric 612 may generally include a combination of optical signaling media (such as optical cabling) and optical switching infrastructure via which any particular sled in data center 600 can send signals to (and receive signals from) the other sleds in data center 600. The signaling connectivity that optical fabric 612 provides to any given sled may include connectivity both to other sleds in a same rack and sleds in other racks.

A sled may be implemented, e.g., as a card having certain ones of the computing system components described above with respect to FIG. 5a. For example, a first type of sled may be composed of CPU elements, a second type of sled may be composed of system memory elements, a third type of sled may be composed of peripheral I/O elements, a fourth type of card may be composed of mass storage elements, etc. Alternatively or in combination a fourth type of sled may approximately correspond to a computing system (e.g., having CPU, system memory, peripheral I/O and mass storage elements or some combination thereof). For example, in various embodiments, each blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Data center 600 includes four racks 602A to 602D and racks 602A to 602D house respective pairs of sleds 604A-1 and 604A-2, 604B-1 and 604B-2, 604C-1 and 604C-2, and 604D-1 and 604D-2. Thus, in this example, data center 600 includes a total of eight sleds. Optical fabric 612 can provide sled signaling connectivity with one or more of the seven other sleds. For example, via optical fabric 612, sled 604A-1 in rack 602A may possess signaling connectivity with sled 604A-2 in rack 602A, as well as the six other sleds 604B-1, 604B-2, 604C-1, 604C-2, 604D-1, and 604D-2 that are distributed among the other racks 602B, 602C, and 602D of data center 600. The embodiments are not limited to this example. For example, fabric 612 can provide optical and/or electrical signaling.

It is envisioned that aspects of the embodiments herein can be implemented in various types of computing and networking equipment, such as switches, routers and blade servers such as those employed in a data center and/or server farm environment. Typically, the servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities can typically employ large data centers with a multitude of servers.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The invention claimed is:

1. A liquid cooling system, comprising:
a heat sink to provide a warmed liquid, the heat sink to receive heat generated by at least one semiconductor chip of an electronic system;
a heat exchanger to receive the warmed liquid and to provide a cooled liquid;
a pump, the pump to draw the cooled liquid at the pump's input so that respective pressures of the warmed and cooled liquids are less than atmospheric pressure; and,
a reservoir between an output of the pump and the heat sink, the heat exchanger positioned upstream from the pump and being a separate component than the reservoir, a pressure transition in the cooled liquid existing downstream from the reservoir and upstream from the heat sink, the pressure transition being from not less than atmospheric pressure to less than atmospheric pressure in a direction of the cooled liquid's fluid flow.

2. The liquid cooling system of claim 1 further comprising an opening in the reservoir to set the cooled liquid in the reservoir to atmospheric pressure.

3. The liquid cooling system of claim 1 further comprising a region of constriction to provide the pressure transition.

4. The liquid cooling system of claim 3 wherein the cooled liquid has atmospheric pressure upstream from the region of constriction.

5. The liquid cooling system of claim 1 wherein the liquid cooling system is contained within the electronic system.

6. The liquid cooling system of claim 1 wherein the heat sink is within the electronic system and at least one of the pump and the heat exchanger are outside the electronic system.

7. The liquid cooling system of claim 1 further comprising a second heat sink, the second heat sink to receive heat generated by at least one other semiconductor chip, the second heat sink fluidically coupled between an output of the pump and an input of the heat exchanger.

8. The liquid cooling system of claim 7 wherein the at least one other semiconductor chip is part of another electronic system.

9. The data center of claim 1 further comprising a second heat sink, the second heat sink to receive heat generated by at least one other semiconductor chip, the second heat sink fluidically coupled between an output of the pump and an input of the heat exchanger.

10. A data center, comprising:
a computing system and a networking system, at least one of the computing system and networking system comprising at least one semiconductor chip that is thermally coupled to a heat sink so that the heat sink receives heat from the at least one semiconductor chip, the heat sink being a component of a liquid cooling system comprising a pump, the pump to draw liquid at the pump's input so as to lower a pressure of the liquid to less than atmospheric pressure, the liquid cooling system comprising a reservoir between an output of the pump and the heat sink, the liquid cooling system comprising a heat exchanger positioned upstream from the pump and being a separate component than the reservoir, the heat exchanger to provide a cooled liquid, a pressure transition in the cooled liquid existing downstream from the reservoir and upstream from the heat sink, the pressure transition being from not less than atmospheric pressure to less than atmospheric pressure in a direction of the cooled liquid's fluid flow.

11. The data center of claim 10 further comprising an opening in the reservoir to set the reservoir's liquid to atmospheric pressure.

12. The data center of claim 10 further comprising a region of constriction to provide the pressure transition.

13. The data center of claim 10 wherein the liquid cooling system is contained within the at least one of the computing system and networking system.

14. The data center of claim 10 wherein the heat sink is within the at least one of the computing system and networking system and at least one of the pump and heat exchanger of the liquid cooling system are outside the at least one of the computing system and networking system.

15. A method, comprising:
drawing liquid at an input of a pump of a liquid cooling system to lower a pressure of the liquid cooling system's liquid to less than atmospheric pressure;

flowing the liquid into a reservoir that is upstream from a heat sink of the liquid cooling system to set a pressure of the reservoir's liquid to a higher pressure; and, flowing the liquid through a constriction located between the reservoir and the heat sink to transition the liquid from the higher pressure to the less than atmospheric pressure;

flowing the liquid from the constriction through the heat sink and into a heat exchanger, the heat exchanger positioned upstream from the pump and being a separate component than the reservoir, the fluid being warmed between the heat sink and the heat exchanger and cooled from the heat exchanger to the heat sink.

16. The method of claim 15 wherein the reservoir has an opening to an ambient surrounding and the higher pressure is atmospheric pressure.

17. The method of claim 15 wherein the heat sink receives heat from at least one semiconductor chip.

* * * * *